(12) United States Patent
Gonzales et al.

(10) Patent No.: US 6,273,101 B1
(45) Date of Patent: *Aug. 14, 2001

(54) METHOD FOR POST CHEMICAL-MECHANICAL PLANARIZATION CLEANING OF SEMICONDUCTOR WAFERS

(75) Inventors: David Gonzales; Guy F. Hudson, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/235,225

(22) Filed: Jan. 22, 1999

Related U.S. Application Data

(63) Continuation of application No. 08/915,992, filed on Aug. 21, 1997, now Pat. No. 5,894,852, which is a continuation of application No. 08/574,660, filed on Dec. 19, 1995, now Pat. No. 5,679,169.

(51) Int. Cl.⁷ .................................. B08B 3/12; B08B 3/00
(52) U.S. Cl. .................................. 134/1.3; 134/28; 134/26; 216/38; 216/39
(58) Field of Search ........................... 134/2, 3, 26, 28, 134/6, 1.3; 216/39, 38; 438/689, 691, 692, 700, 703

(56) References Cited

U.S. PATENT DOCUMENTS

| 4,638,553 | | 1/1987 | Nilarp . | |
|---|---|---|---|---|
| 4,962,776 | * | 10/1990 | Liu et al. | 134/11 |
| 4,973,563 | * | 11/1990 | Prigge et al. | 438/692 |
| 5,174,816 | | 12/1992 | Aoyama et al. . | |
| 5,290,361 | * | 3/1994 | Hayashida et al. | 134/2 |
| 5,389,194 | | 2/1995 | Rostoker et al. . | |
| 5,397,397 | | 3/1995 | Awad . | |
| 5,492,858 | * | 2/1996 | Bose et al. | 437/67 |
| 5,498,293 | * | 3/1996 | Ilardi et al. | 134/3 |
| 5,551,986 | * | 9/1996 | Jain | 134/6 |
| 5,679,169 | * | 10/1997 | Gonzales et al. | 134/1.3 |
| 5,894,852 | * | 4/1999 | Gonzales et al. | 134/1.3 |

* cited by examiner

Primary Examiner—Alexander Markoff
(74) Attorney, Agent, or Firm—Perkins Coie LLP

(57) ABSTRACT

The inventive method cleans residual titanium accumulations and other undesirable materials from a planarized surface of a wafer to produce a planarized surface with less than about fifty defects per wafer. After a metallic layer of material has been planarized using a CMP process, loose residual particles of undesirable material are removed from the planarized surface. The residual titanium accumulations remaining on the planarized surface are then detached from the planarized surface, which produces additional, new particles on the surface of the wafer. The additional particles produced by the detaching step are then scrubbed from the planarized surface until the planarized surface has less than approximately 50 defects per wafer.

7 Claims, 2 Drawing Sheets

METHOD FOR POST CHEMICAL-MECHANICAL PLANARIZATION CLEANING OF SEMICONDUCTOR WAFERS

CROSS-REFERENCE TO RELATED APPLICATIONS

This application is a continuation of U.S. patent application Ser. No. 08/915,992, filed Aug. 21, 1997, now U.S. Pat. No. 5,894,852, which is continuation of application Ser. No. 08/574,660, filed Dec. 19, 1995 now U.S. Pat. No. 5,679,169.

TECHNICAL FIELD

The present invention relates to a method for cleaning semiconductor wafers after they have been planarized by chemical-mechanical planarization processes.

BACKGROUND OF THE INVENTION

Chemical-mechanical planarization ("CMP") processes are frequently used to planarize the surface layers of wafer in the produciton of ultra-high density integrated circuits. In typical CMP processes, a wafer is pressed against a slurry on a polishing pad under controlled chemical, pressure, velocity, and temperature conditions. Slurry solutions generally contain small, abrasive particles that mechanically remove the surface layer of the wafer, and chemicals that chemically remove the surface layer. The polishing pad is generally a planar pad made from a relatively soft, porous material, such as blown polyurethane. After the wafer is planarized, it is cleaned to remove residual particles on the surface of the wafer that were introduced to the CMP process by the slurry, polishing pad, or wafer.

CMP processing is particularly useful for planarizing a metallic surface layer to form conductive features, such as interlayer connectors and/or conducting lines. Interlayer connectors are fabricated by forming holes through a dialectric layer, depositing a very thin titanium liner over the dielectric layer and in the holes, depositing a layer of metallic material over the titanium liner and in the holes, and then planarizing the metallic material layer to an end-point just below the upper surface of the dielectric layer. Conducting lines are created by forming parallel channels in a substrate, depositing a very thin titanium liner over the substrate and in the channels, depositing a layer the metallic material over the titanium liner and in the channels, and then planarizing the metallic layer to an end-point below the top of the substrate. The metallic layers of material are desirable planarized using slurries that contain abrasive particles made from aluminum oxide ($Al_2O_3$). After the metallic layers are planarized, residual materials from the slurry, polishing pad, or wafer remain on the planarized surface of the wafer. The residual materials are commonly aluminum oxide particles from the slurry and titanium accumulations from the titanium liner, both of which cause defects in the wafer. Thus, it is necessary to clean such residual materials from the planarized surface of the wafer.

One problem with current post-CMP cleaning processes is that they still allow a significant number of defects to remain on each wafer. In a typical post-CMP cleaning process, the wafer is placed in a bath of deionized water that is vibrated with sonic energy. The sonic deionization bath removes the loose residual particles of aluminum oxide from the surface layer of the wafer, but it does not remove the residual titanium accumulations. The sonic deionization bath produces a wafer surface that has approximately 20 to 30 defects per wafer. To remove the residual titanium accumulations from the planarized surface, the wafer is dipped in hydrogen fluoride solution ("HF solution") that etches the residual titanium accumulations and some of the oxide from the surface of the wafer. Although the HF solution removes the residual titanium accumulations, it also produces new defects in the wafer so that the resulting wafer surface has 300 to 400 defects per wafer. Accordingly, it would be desirable to develop a method that removes both the residual titanium accumulations and other residual materials from a planarized wafer to produce a wafer surface that has less than fifty defects per wafer.

SUMMARY OF THE INVENTION

The inventive method cleans residual titanium accumulations and other residual materials from a planarized surface of a wafer to produce a wafer surface with less than about fifty defects per wafer. After a metallic layer of material has been planarized using a CMP process, loose residual particles of undesirable material are removed from the planarized surface. The residual titanium accumulations remaining on the planarized surface are then detached from the planarized surface, which produces additional, new loose particles on the surface of the wafer. The additional particles produced by the detaching step are then scrubbed from the planarized surface until the planarized surface has less than approximately 50 defects per wafer.

DETAILED DESCRIPTION OF THE INVENTION

The present invention provides a post-CMP cleaning process that removes residual titanium accumulations, particles of aluminum oxide, and other particles from the surface of a wafer to produce a finished wafer surface with less than about fifty defects per wafer. Prior to the present invention, post-CMP cleaning processes that removed residual titanium accumulations from the surface of the wafer with a HF solution resulted in 300 to 400 defects per wafer. A central aspect of the present invention is the discovery that the HF solution liberates aluminum oxide particles from the slurry that were embedded into the surface of the wafer during CMP processing. The method of the present invention further cleans the surface of the wafer to remove the liberated particles of aluminum oxide from the surface of the wafer, thus reducing the number of defects on the wafer surface.

Figure 1:
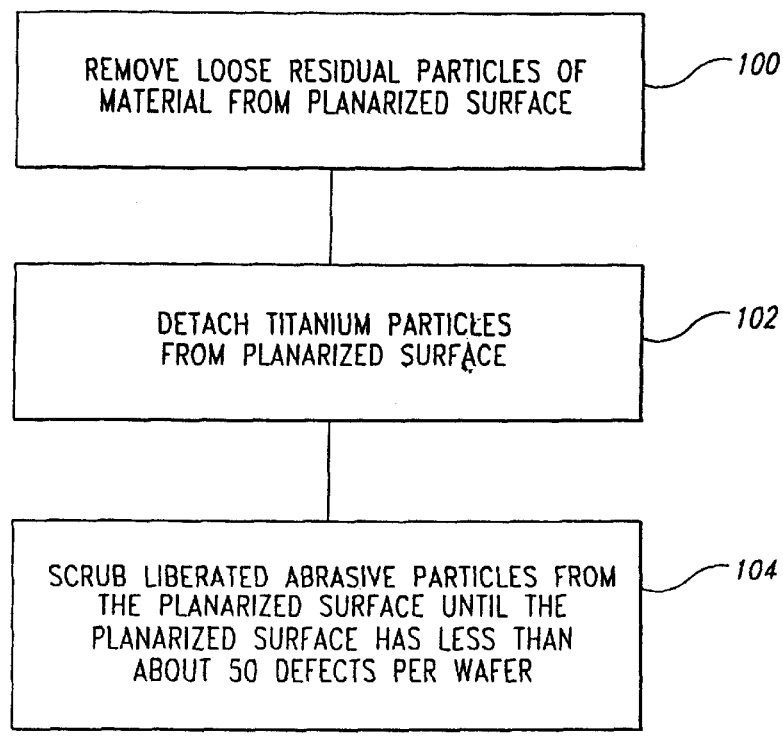
FIG. 1 is a flow chart illustrating a post-CMP wafer cleaning method in accordance with the invention.

FIG. 1 schematically illustrates a post-CMP cleaning process, in accordance with the invention, that removes residual titanium accumulations and residual particles of other materials from the surface of the wafer to produce a finished surface with less than about fifty defects per wafer. The post-CMP cleaning process of the invention is directed towards cleaning planarized surfaces with metallic features such as interlayer connectors or conducting lines. After such a wafer has been planarized, residual particles from the slurry, pad and wafer remain loose on the planarized surface, and titanium accumulations from the titanium liner remain bonded to the planarized surface. The first step 100 of the method is to remove the loose residual particles of material from the planarized surface of the wafer. The residual titanium accumulations are not removed by the removing step 100 of the method because the removing step 100 is not chemically aggressive with respect to titanium. Accordingly, the second step 102 of tile method is to detach the titanium accumulations from the planarized surface. The detaching step is preferably performed with a light etchant that dissolves the titanium and removes it from the surface of the wafer. The detaching step 102 is more aggressive towards titanium and the wafer than the removing step 100, which causes a thin layer of material to be etched from the top of the planarized surface of the wafer. As a result, the detaching step 102 increases the number of defects per wafer because it liberates a significant number of aluminum oxide particles from the slurry that were embedded into the wafer during CMP processing. The third step 104 of the method, therefore, is to scrub the liberated abrasive particles of aluminum oxide from the planarized surface of the wafer until the planarized surface has less than about fifty defects per wafer. Each step of the above-described method of the invention is described in detail below with respect to FIGS. 3–6.

Figure 2:
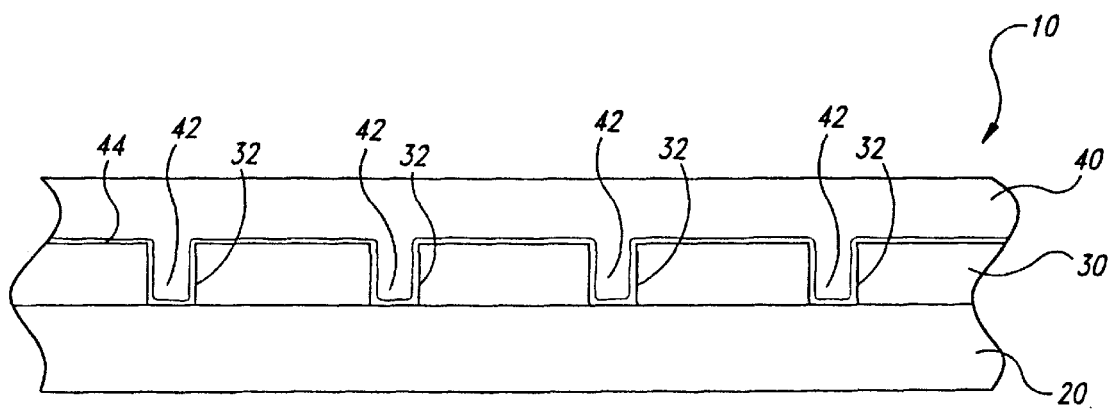
FIG. 2 is a schematic cross-sectional view of a wafer with a metallic layer before planarization.

FIG. 2 illustrates a typical wafer 10 with a substrate 20, a dielectric layer 30, and a metal layer 40. The scope of the invention is not limited to a specific wafer design, and thus the wafer 10 may have many different configurations to which the post-CMP cleaning process of the invention may be applied. For the purposes of describing the method of the invention, a number of holes 32 are formed in the dielectric layer 30 in a pattern that corresponds to the desired location for interlayer connectors. A thin titanium liner 44 is deposited over the dielectric layer 30 and into the holes 32 to enhance the bonding of other metals to the wafer 10. The metal layer 40 is then deposited over the titanium liner 44 so that it fills the holes 32 and covers the titanium liner 44. The portion of the metal layer 40 in the holes 32 will form a number of interlayer connectors 42 after the metal layer is planarized using a CMP process. The metal layer 40 is preferably made from tungsten, but it may alternatively be made from aluminum or any other suitable highly conductive material.

Figure 3:
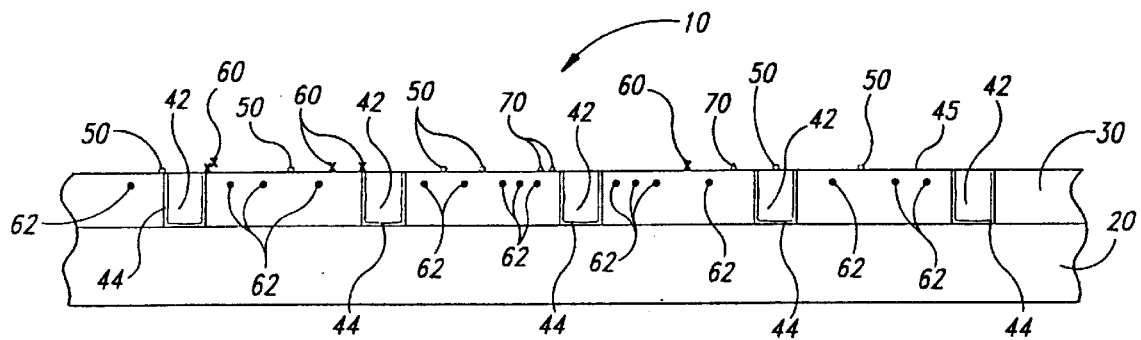
FIG. 3 is a schematic cross-sectional view of the wafer of FIG. 2 after it has been planarized.

FIG. 3 illustrates the wafer 10 after it has been planarized by a typical CMP process. CMP processes may vary according to the specific requirements of a given circuit or a given CMP machine. Suitable CMP machines include Westech Model Nos. 372 and 472, and Strasbaugh Model No. 6DS-SP. CMP processes for planarizing metallic layers generally use a slurry containing abrasive particles made from aluminum oxide, but the abrasive particles may be made from other materials as well. The scope of the invention, therefore, is not limited to post-CMP cleaning of wafers that have been planarized by a slurry with aluminum oxide particles.

The metal layer 40, the titanium liner 44, and a portion of the dielectric layer 30 are planarized to an end-point that is below the upper surface of the dielectric layer 30. After the metal layer 40 has been removed, the interlayer connectors 42 are electrically isolated from one another by the remaining portions of the dielectric layer 30. Planarizing the wafer produces residual titanium accumulations 50, residual abrasive slurry particles 60, and other types of residual particles 70 on the planarized surface 45 of the wafer 10. The residual titanium accumulations 50 bond to the planarized surface 45. The residual abrasive slurry particles 60 and other types of residual particles 70 are generally loose on and unattached to the planarized surface 45. In accordance with the discovery of the present invention, a number of abrasive slurry particles 62 are also embedded into the wafer 10 during the CMP process to a depth that is just slightly below the top of the planarized surface 45.

Figure 4:
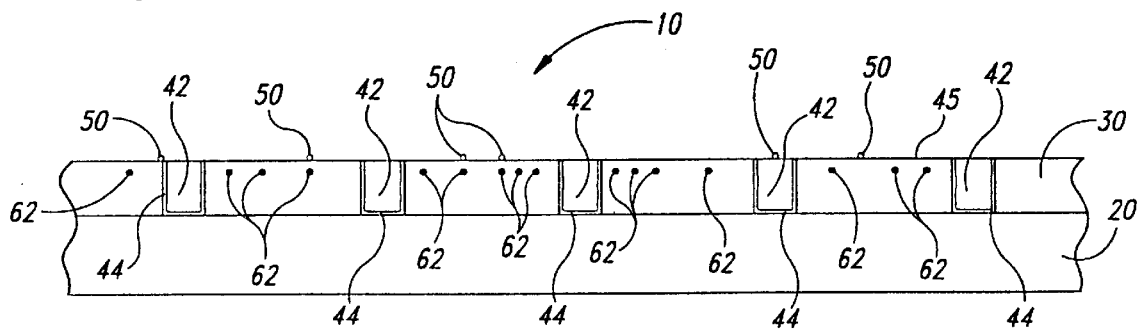
FIG. 4 is a schematic cross-sectional view of the wafer of FIG. 3 after it has been washed in a vibrating bath of deionized water in accordance with the invention.

FIG. 4 illustrates the wafer 10 after the loose residual abrasive slurry particles 60 and other residual particles 70 on the planarized surface 45 of the wafer 10 have been removed in accordance with the first step 100 of the method of the invention. The loose residual particles 60 and 70 are preferably removed from the planarized surface 45 by placing the wafer 10 in a bath of deionized water (not shown), and imparting vibrational energy to the bath. The wafer 10 is subject to the vibrating deionized water bath for approximately 5 to 600 seconds, and preferably for about 180 to 300 seconds. In a preferred embodiment, the vibrational energy is acoustical energy that is imparted to the bath through the walls of a container (not shown). Suitable megasonic hoods that provide a vibrating deionized water bath are manufactured by Verteq Corporation and SubMicron Systems Company. The deionized water bath may also contain other chemicals, such as a 1% basic solution, to further enhance the removal of loose particles from the planarized surface 45 of the wafer 10" with the sentence—Other chemicals, such as a 1% basic solution, may be added to the deionized water bath to further enhance the removal of loose particles from the planarized surface 45 of the wafer 10.

The vibrating deionized water bath removes the loose residual abrasive slurry particles 60 and other residual particles 70 from the planarized surface 45 of the wafer 10. The deionized bath, however, is not aggressive and does not remove the residual titanium accumulations 50 from the planarized surface 45. The deionized bath also does not remove the embedded abrasive slurry particles 62 because these particles are also fixedly attached to the wafer 10. After the wafer 10 is cleaned in a vibrating deionized water bath, the residual titanium accumulations 50 are detached from the planarized surface 45 of the wafer 10.

Figure 5:
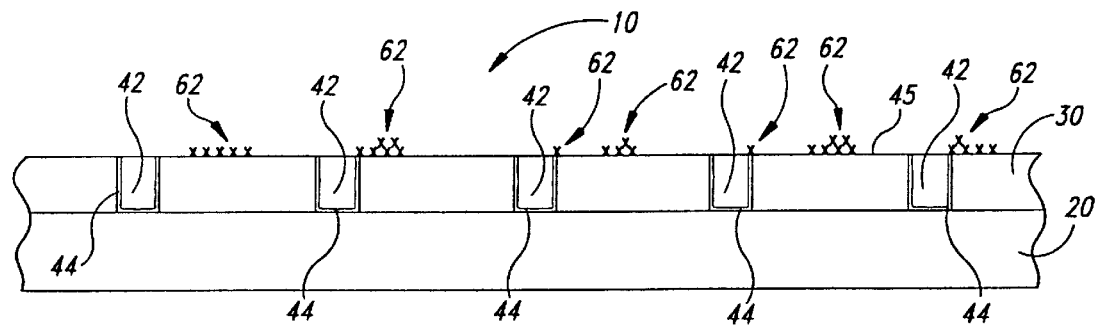
FIG. 5 is a schematic cross-sectional view of the wafer of FIG. 4 after it has been dipped in a HF solution in accordance with the invention.

FIG. 5 illustrates the wafer 10 after the residual titanium accumulations 50 have been detached from the planarized surface 45 of the wafer 10 in accordance with step 102 of the method of the invention. In a preferred embodiment, the residual titanium accumulations 50 are detached from the planarized surface 45 by dipping the wafer 10 in a HF solution for approximately 5–60 seconds. Suitable hoods for dipping the wafer 10 in a HF solution are the Verteq and SubMicron Systems hoods. The HF solution typically, is a solution with approximately 100 parts water and 1 part HF, which slightly etches the planarized surface 45 of the wafer 10. The etching effect of the HF solution liberates the embedded abrasive slurry particles 62 from the wafer 10. After the embedded abrasive slurry particles 62 are liberated, they tend to aggloinerate in clusters on the planarized surface 45. Depending upon the downforce used during the CMP process and the number of abrasive particles in the slurry, the detaching step results in a planarized surface 45 with approximately 300 to 400 defects per wafer. After the wafer 10 is dipped in an HF solution, the clusters of previously embedded abrasive slurry particles 62 are scrubbed from the planarized surface 45 of the wafer 10.

Figure 6:
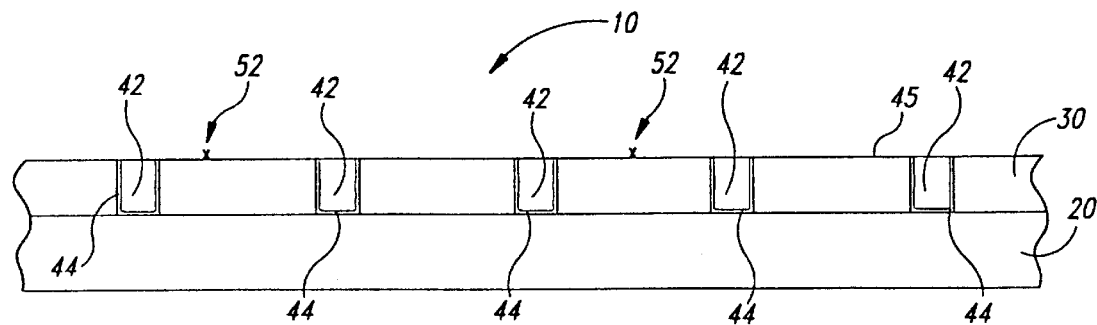
FIG. 6 is a cross-sectional view of the wafer of FIG. 5 after it has been scrubbed with deionized water in accordance with the invention.

FIG. 6 illustrates the wafer 10 after the clusters of abrasive slurry particles 62 (shown in FIG. 5) have been scrubbed from the planarized surface 45 of the wafer 10 in accordance with step 104 of the method of the invention. In a preferred embodiment, the clusters of abrasive slurry particles 62 are scrubbed from the planarizing surface 45 with a scrubbing solution and polyvinyl alcohol brushes. The scrubbing step is generally performed by a Series 1 or Series 2 polyvinyl alcohol brush manufactured by Ontrak Company. Since the etching effect of the HF solution substantially breaks the connection between the abrasive slurry particles 62 and the wafer 10, the resulting clusters of abrasive slurry particles are easily removed by scrubbing the wafer 10 with a scrubbing solution of deionized water, or solutions of deionized water with ammonia, tetramethola-mmonium hydroxide (TMAH), or citric acid. In one embodiment, the scrubbing solution contains 1%–10% ammonia by weight. In another embodiment, the scrubbing solution contains approximately 10–200 milliliters TMAH and 18–38 liters deionized water, and preferably approximately 20 milliliters of TMAH and 19 liters of deionized water. In still another embodiment, the scrubbing solution contains approximately 1–50 grams citric acid and 18–38 liters of deionized water, and preferably approximately 25 grams citric acid and 19 liters deionized water. The resulting surface layer 45 of the wafer 10, accordingly, has very few defects. When the wafer 10 is scrubbed with a scrubbing solution for approximately 5–60 seconds, the number of defects on the wafer surface is reduced from between 300 and 400 defects per wafer to approximately 5 to 30 defects per wafer.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In the manufacturing of semiconductor devices, a method of forming a feature on a wafer, comprising;

forming a plurality of recesses in a dielectric layer on the wafer, each recess extending from a top surface of the dielectric layer tough at least a portion of the dielectric layer;

disposing a first layer on the dielectric layer to have a plurality of first sections partially filling the recesses and a second section covering the top surface of the dielectric layer, the first layer comprising a metal;

depositing a second layer on the first layer to have a first portion filling the recesses and a second portion on the second section of the first layer over the top surface of the dielectric layer;

chemically-mechanically planarizing the wafer to remove the second portion of the first layer over the top surface of the dielectric layer, the planarizing procedure forming a planarized surface on the wafer in which the first sections of the first layer are isolated in the recesses;

removing residual particles from the planarized surface;

detaching remaining material of the second section of the first layer from the top surface of the dielectric layer, wherein detaching the remaining material of the second section of the first layer liberates particles in the planarized surface that were embedded into the planarized surface during the chemical-mechanical planarizing procedure; and scrubbing the particles from the planarized surface after removing the residual particles and detaching the remaining materials of the second section.

2. The method of claim 1 wherein:

the first layer comprises titanium and the second layer comprises a second metal; and removing the residual particles comprises placing the wafer in a vibrating bath of deionized wafer to remove the residual particles and detaching the remarks materials comprises dipping the wafer in a detaching solution by immersing the wafer in a solution of hydrogen fluoride.

3. The method of claim 2 wherein the hydrogen fluoride solution comprises 100 parts deionized water to 1 part hydrogen fluoride.

4. The method of claim 1 wherein:

the first layer comprises titanium and the second layer comprises a second metal; and scrubbing the particles from the planarized surface comprises brushing the wafer with polyvinyl alcohol brushes and a scrubbing solution.

5. The method of claim 4 wherein the scrubbing solution comprises deionized water.

6. The method of claim 4 wherein the scrubbing solution comprises approximately 1%–10% by weight ammonia and 90%–99% by weight deionized water.

7. The method of claim 4 wherein the scrubbing solution comprises approximately 10–200 milliliters of tetramethola-mmonium hydroxide and 18–38 liters of deionized water.

* * * * *

UNITED STATES PATENT AND TRADEMARK OFFICE
CERTIFICATE OF CORRECTION

PATENT NO. : 6,273,101 B1
DATED : August 14, 2001
INVENTOR(S) : Gonzales et al.

It is certified that error appears in the above-identified patent and that said Letters Patent is hereby corrected as shown below:

Column 1,
Line 22, insert -- a -- between "of" and "wafer";
Line 23, "produciton" should be -- production --;
Lines 39-40, "dia-lectric" should be -- die-lectric --;
Line 43, "metallic material layer" should be -- metallic layer --;
Line 47, "layer the metallic" should be -- layer of metallic --;
Line 50, "desirable" should be -- desirably --;

Column 3,
Line 16, "tile" should be -- the --;

Column 4,
Line 62, "aggloinerate" should be -- agglomerate --;

Column 5,
Lines 17-18, "tetramethola-mmonium hydroxide" should be
-- tetramethola-mmoniumhydroxide --;
Line 42, delete semicolon after "comprising" and insert colon in place thereof;
Line 45, "tough" should be -- through --;

Signed and Sealed this

Sixth Day of May, 2003

JAMES E. ROGAN
*Director of the United States Patent and Trademark Office*